United States Patent [19]

Shimizu et al.

[11] Patent Number: 5,086,013

[45] Date of Patent: Feb. 4, 1992

[54] METHOD FOR FINE PATTERNING

[75] Inventors: Ryu Shimizu; Shun-ichi Kobayashi, both of Ibaraki, Japan

[73] Assignee: Sanyo Electric Co., Ltd., Osaka, Japan

[21] Appl. No.: 388,595

[22] Filed: Aug. 2, 1989

[30] Foreign Application Priority Data

Aug. 10, 1988 [JP] Japan .................................. 63-200553

[51] Int. Cl.$^5$ .................. H01L 21/283; H01L 21/312; H01L 21/3205
[52] U.S. Cl. ...................................... 437/80; 437/187; 437/192; 437/229; 437/944
[58] Field of Search .............. 437/944, 229, 192, 187, 437/80; 148/DIG. 100, DIG. 43; 430/272, 327

[56] References Cited

FOREIGN PATENT DOCUMENTS 0076428 5/1984 Japan .................................. 430/272
0095856 5/1987 Japan .................................. 437/944

Primary Examiner—Robert Kunemund
Assistant Examiner—Ourmazd S. Ojan
Attorney, Agent, or Firm—Darby & Darby

[57] ABSTRACT

A lift-off method for fine patterning includes the steps of: applying a photoresist layer to a substrate; implanting ions into predetermined regions in a surface layer of the photoresist layer; irradiating the photoresist layer with ultraviolet from above; developing the photoresist layer to form a resist pattern for lift-off; depositing a desired material with a predetermined thickness from above the resist pattern; and removing the resist pattern, thereby lifting off the material on the resist pattern, whereby a fine pattern of the desired material is left on the substrate.

11 Claims, 4 Drawing Sheets

METHOD FOR FINE PATTERNING

BACKGROUND OF THE INVENTION

1. Field of the Invention

The present invention relates to a method for fine patterning and particularly to an improvement in a method for fine patterning useful in manufacturing of semiconductor devices.

2. Description of the Background Art

A lift-off method is known as a method for forming a fine conductor pattern for a semiconductor device and it is described for example by J. M. Frary and P. Seese in Semiconductor International, Vol. 4, No. 12, 1981, pp. 72–88. The lift-off method is easier in dimensional control of patterns compared with an etching method and makes it possible to form a fine pattern with a high resolution.

FIGS. 1A to 1D are schematic sectional views illustrating an example of a conventional lift-off method.

Referring to FIG. 1A, a resist layer 2 is applied to a substrate 1. Light ions which can attain the substrate 1 are implanted into predetermined regions 3 of the resist layer 2 by a focused ion beam (FIB) method for example.

Referring to FIG. 1B, the resist layer 2 is developed by a suitable solvent, so that the ion-implanted regions 3 are removed. As a result, a pattern of the resist portions 2a is left on the substrate 1.

Referring to FIG. 1C, conductor layers 4a and 4b are deposited from above by vacuum evaporation for example to cover the upper surfaces of the resist portions 2a and the exposed upper surface regions of the substrate 1. After that, the resist portions 2a are removed by using a suitable solvent and consequently the conductor layers 4a on the resist portions 2a are lifted off. On this occasion, the solvent contacts the resist portions 2a through the gaps between the conductor layers 4a and 4b as shown by the arrow 1G.

Referring to FIG. 1D, a desired conductor pattern 5 is left on the substrate 1 after the resist portions 2a and the conductor layers 4a thereon have been removed.

In the above described process, if the conductor pattern 5 becomes fine to increase an aspect ratio (i.e., a ratio of a height to a width) of the conductor 4b, the respective gaps 1G between the conductor layers 4a and 4b in FIG. 1C tend to be decreased. Accordingly, insufficient contact occurs in the resist portions 2a and the solvent through the respective gaps 1G, and the conductor layers 4a on the resist portions 2a are liable to be incompletely lifted off. Thus, if conductor portions 4b of a submicron or quartermicron width are formed on the substrate 1, the resist portions 2a and the conductor layers 4a thereon might partially remain.

FIGS. 2A to 2D are schematic sectional views illustrating another lift-off method which was devised prior to the present invention.

Referring to FIG. 2A, a resist layer 21 is applied to a silicon substrate 20. Heavy ions such as gallium are implanted into predetermined regions in the surface of the resist layer 21.

Referring to FIG. 2B, the resist layer 21 is etched by oxygen plasma and a resist pattern 24 for lift-off is formed. On this occasion, since the ion-implanted regions 22 have durability to the oxygen plasma, resist portions 21a remain in regions under the implanted regions 22. However, since the resist layer 21 is isotropically etched by the oxygen plasma, undercuts 25 are also formed under the implanted regions 22.

Referring to FIG. 2C, a conductor material such as a metal is deposited from above the resist pattern 24 by vacuum evaporation, thereby forming a conductor layer 26 on the respective implanted regions 22 and a conductor layer 27 on the substrate 20.

Referring to FIG. 2D, the resist pattern 24 is removed by a suitable solvent and accordingly the conductor layers 26 on the implanted regions 22 are lifted off. As a result, a desired conductor pattern 28 is left on the substrate 20.

As can be seen from FIG. 2C, the undercuts 25 make it easy to contact the respective resist portions 21a and the solvent through the gaps 2G between the implanted regions 22 and the conductor layer 27 on the substrate 20. Consequently, the conductor layers 26 on the implanted regions 22 can be lifted off more reliably.

However, if the aspect ratio of the conductors 27 becomes large, the below described disadvantages are involved.

In order to increase the thickness H of the conductor pattern 28 as shown in FIG. 2D, it is necessary to increase the height h of the resist portions 21a as shown in FIG. 2B.

However, as shown in FIG. 3, after the resist layer 21 is etched to the depth t of the implanted regions 22, the resist layer 21 is also etched under the implanted regions 22. In this case, the etching rate is isotropic and accordingly the resist layer 21 is etched concentrically with each of the lower corners Q and P of the implanted regions 22. In consequence, even if the height h from the surface of the substrate 20 to the bottom surface of each implanted region 22 is increased, the respective implanted regions 22 are separated from the resist layer 21 when the etching depth d becomes equal to a half of the width w of each implanted region 22. Thus, the implanted regions 22 can not be supported in the predetermined positions and the structure of the resist pattern 24 for the lift-off is deformed. If the fine conductor pattern 28 is formed, the width w of each implanted region 22 becomes small. In that case, the height h of the respective resist portions 21a shown in FIG. 2B can not be made large and conductors 27 of a high aspect ratio can not be formed.

SUMMARY OF THE INVENTION

In view of the above described prior art, an object of the present invention is to improve a method for fine patterning.

According to the present invention, a method for fine patterning includes the steps of: applying a photoresist layer to a substrate; implanting ions into predetermined regions in a surface layer of the photoresist layer; irradiating the photoresist layer with ultraviolet from above; developing the photoresist layer to form a resist pattern for lift-off; depositing a desired material to a prescribed thickness from above the resist pattern; and lifting off the material on the resist pattern by removing the resist pattern, whereby a fine pattern of the desired material is left on the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

First of all, a preliminary experiment was conducted to examine influences exerted on characteristics of a resist layer by ions implanted in the surface layer of the resist layer.

A layer of resist including naphthoquinone diazide as photosensitive constituent (e.g., OFPR-800 available from Tokyo Oka Kogyo Co., Ltd.) was applied to a glass substrate. Various doses of gold or silicon ions were implanted into the surfaces of the respective photoresist layers by the FIB method. Intensities of ultraviolet transmitting through those ion-implanted regions were measured by an illuminance meter.

Figure 1A:
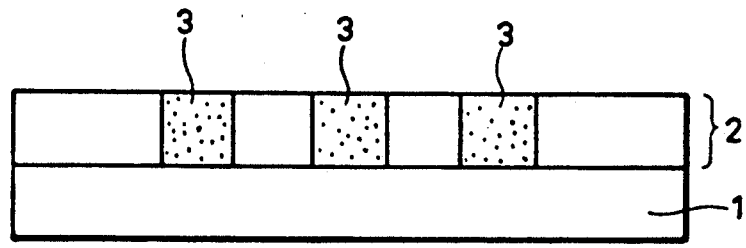
FIGS. 1A to 1D are schematic sectional views illustrating an example of a conventional lift-off method.
Figure 1B:
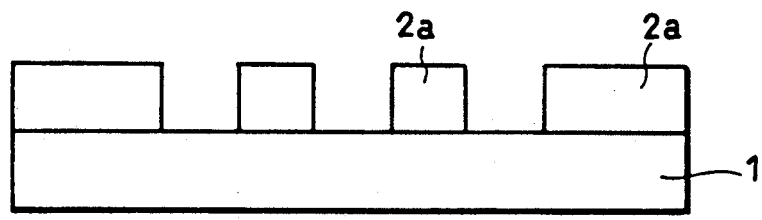
Figure 1C:
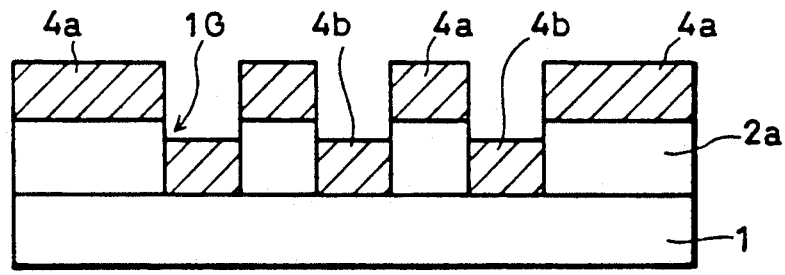
Figure 1D:
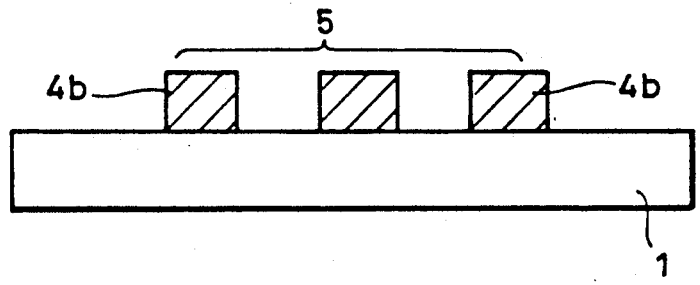
Figure 2A:
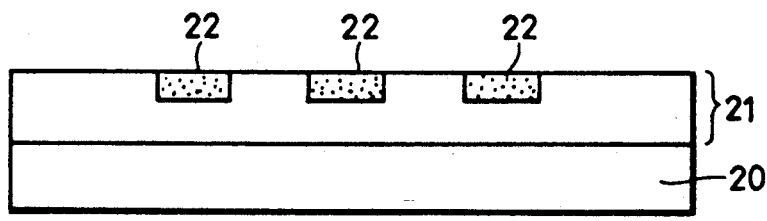
FIGS. 2A to 2D are schematic sectional views illustrating another example of another lift-off method known prior to the subject invention.
Figure 2B:
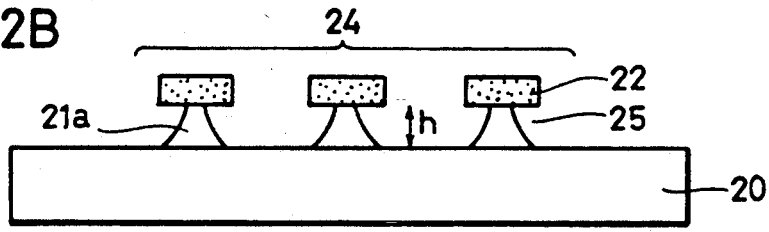
Figure 2C:
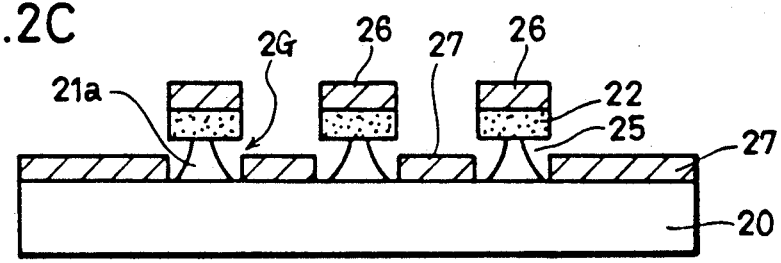
Figure 2D:
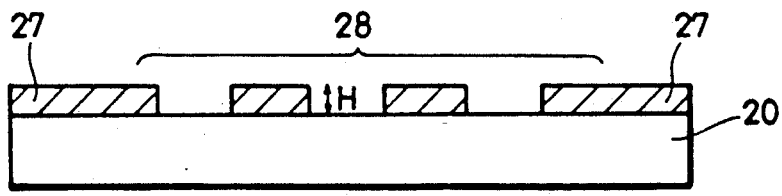
Figure 3:
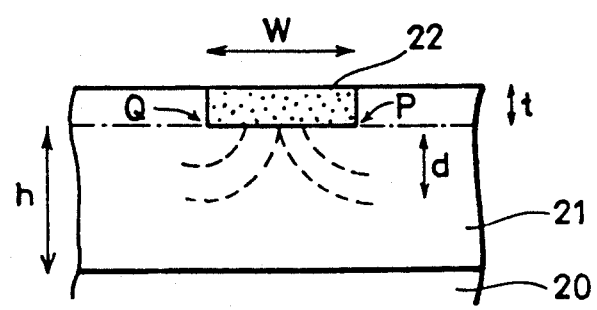
FIG. 3 is a schematic sectional view illustrating a developing process in the lift-off method shown in FIGS. 2A to 2D.
Figure 4:
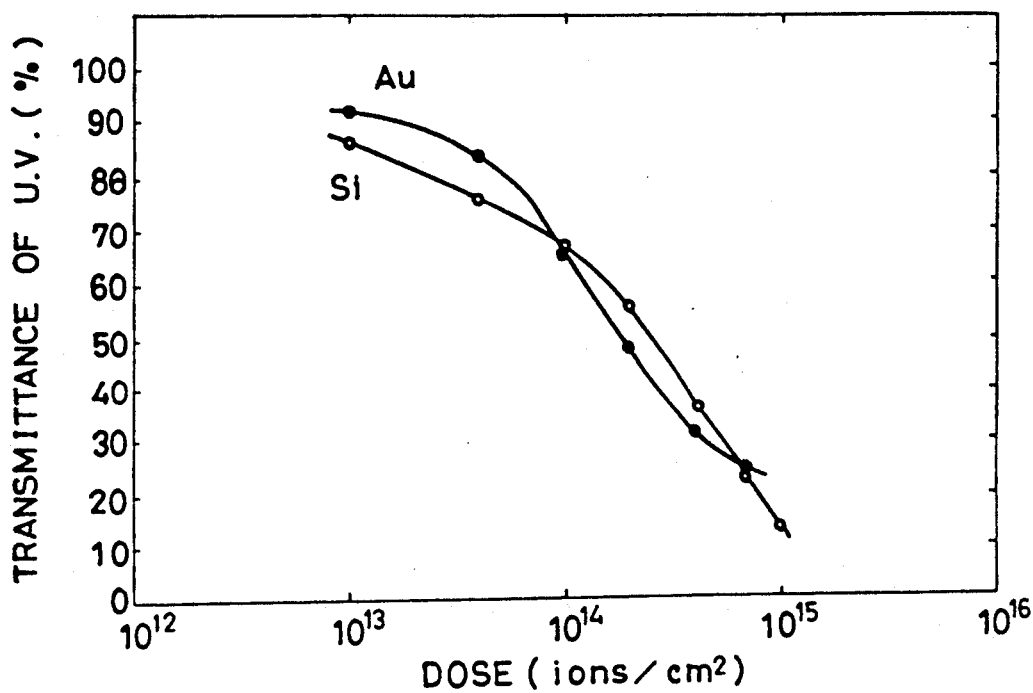
FIG. 4 is a graph showing an influence exerted by ion implantation on ultraviolet transmittance of a photoresist layer.

Referring to FIG. 4, the measured ultraviolet transmittances are shown in relation to the doses of ions. As can be seen from this figure, the ultraviolet transmittance of the photoresist layer decreases according to the increase of the dose of ions. In other words, the implanted regions function as photomasks and the photoresist layer under the implanted regions is less exposed to the ultraviolet.

Each of the photoresist layers implanted with silicon ions and exposed to the ultraviolet was developed by a developing solution TMAH (TETRA-METHYL AMMONIUM HYDROXIDE) (available from Tokyo Oka Kogyo Co., Ltd. as NMD-3) and the developing rates under the implanted regions were measured.

Figure 5:
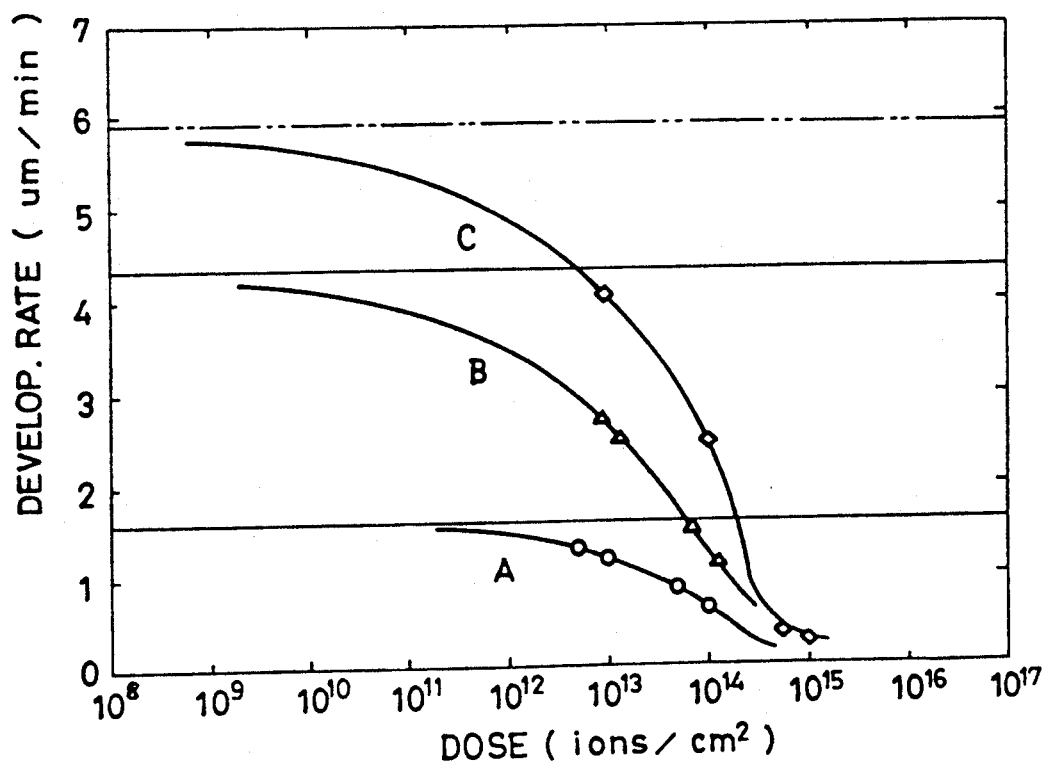
FIG. 5 is a graph showing a relation between a dose of ions and a developing rate of photoresist.

Referring to FIG. 5, the measured developing rates are shown in relation to the doses of ions. The curves A, B and C represent the developing rates in the photoresist layers exposed to ultraviolet rays of 37.4 mJ/cm$^2$, 74.8 mJ/cm$^2$ and 130.9 mJ/cm$^2$, respectively. The level of the developing rate of about 6 $\mu$m/min shown by the chain line corresponds to the developing rate in he case in which a photoresist layer not implanted with ions is exposed directly to ultraviolet rays of 130.9 mJ/cm$^2$.

As is understood from FIG. 5, the developing rate of the photoresist layer under the implanted regions decreases according to the increase of the dose of ions. Thus, by increasing the dose of ions, it is possible to decrease the developing rate in the horizontal direction of the photoresist layer under the implanted regions.

FIG. 6A to 6E are schematic sectional views illustrating a method according to an embodiment of the present invention.

Figure 6A:
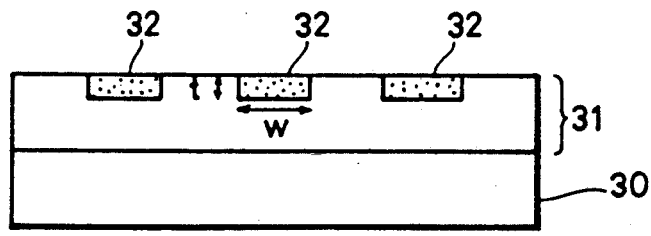
FIGS. 6A to 6E are schematic sectional views illustrating a lift-off method according to an embodiment of the present invention.

Referring to FIG. 6A, a photoresist layer 31 of OFPR-800 was applied to a silicon substrate 30 to a thickness of 1.02 $\mu$m. Silicon ions were implanted by the FIB method into predetermined regions 32 in the surface layer of the photoresist layer 31. Each of those predetermined regions 32 was implanted with a dose of $1.0 \times 10^{14}$ ions/cm$^2$ and had a depth t=0.2 $\mu$m and a width w=1.4 $\mu$m.

Figure 6B:
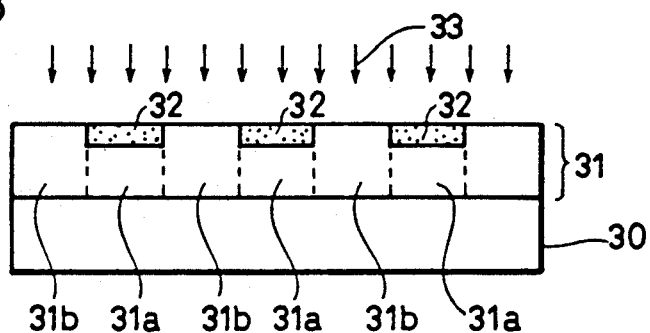

Referring to FIG. 6B, the photoresist layer 31 was exposed to ultraviolet ray 33 of 130.9 mJ/cm$^2$ by using the implanted regions 32 as photomasks.

Figure 6C:
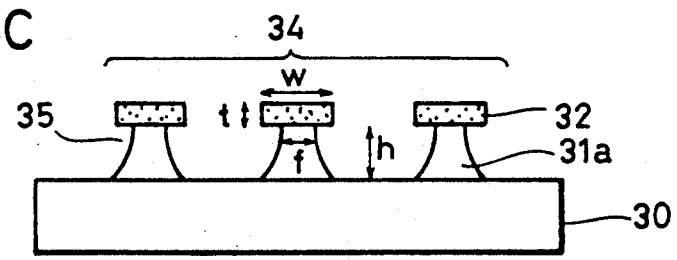

Referring to FIG. 6C, the photoresist layer 31 is developed by developer NMD-3. In this case, the developing rate in the photoresist portions 31a covered with the photomasks 32 was about 2.5 $\mu$m/min and the developing rate in the photoresist portions 31b not covered with the photomasks 32 was about 5.9 $\mu$m/min. Thus, the photoresist portions 31b not covered with the photomasks 32 were entirely removed in a developing period of about 14 seconds. On this occasion, the photoresist portions 31a covered with the photomasks 32 were also etched and undercuts 35 were formed; however, each of those photoresist portions 31a was left at least with a width f=0.24 $\mu$m immediately under the corresponding photomask 32. Thus, the regions 32 implanted with ions were supported by the remaining photoresist portions 31a and the structure of the obtained resist pattern 34 for lift-off was not broken. The forms of the undercuts 35 can be controlled by changing the dose of the ions.

Figure 6D:
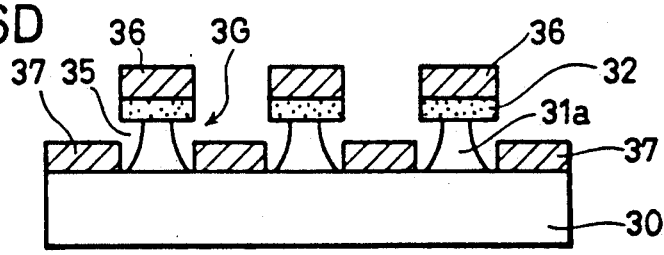

Referring to FIG. 6D, a conductor material of aluminum or gold was deposited with a thickness of 0.7 $\mu$m from above the resist pattern 34 and a conductor layer 36 on the implanted regions 32 and a conductor layer 37 on the substrate 30 were formed.

Figure 6E:
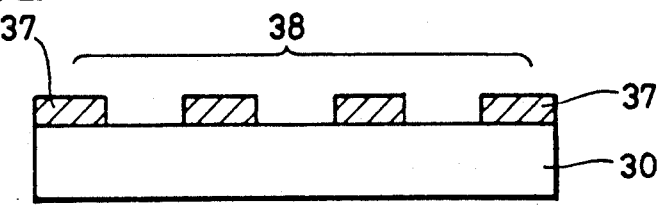

Referring to FIG. 6E, the resist pattern 34 was removed and in consequence the conductor layer portions 36 on the implanted regions 32 were lifted off. As a result, a desired conductor pattern 38 was left on the substrate 30. This pattern 38 may be used as electrodes for a semiconductor device having the silicon substrate 30. The removal of the resist pattern was effected by exposing the pattern to a solvent or a plasma atmosphere. The solvent for this purpose is for example acetone or fluoric acid and the plasma atmosphere is for example an oxygen plasma atmosphere.

According to the present invention, as is understood from FIG. 6C, even if the height h from the surface of the substrate 30 to the bottom surface of each implanted region 32 is large, a sufficient width f for supporting each implanted region 32 can be left. Consequently, the gaps shown by the arrow 3G in FIG. 6D can be made large. Thus, the resist pattern 34 can be reliably removed by using a solvent or a plasma atmosphere easily penetrating through the large gaps 3G. In other words, even if conductor portions 37 of a high aspect ratio having a relative large thickness compared with a small width thereof are deposited on the substrate 30, sufficiently large gaps 3G can be obtained and the conductor portions 36 formed on the resist pattern can be lifted off reliably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fine patterning, comprising in sequence the steps of:

applying a photoresist layer to a substrate, the photoresist layer having a surface layer and a lower layer beneath the surface layer;

implanting ions into predetermined regions in said surface layer of said photoresist layer and leaving other regions in the surface layer free of the implanting of ions, said lower layer thereby being constituted by a first lower portion beneath the predetermined regions and a second lower portion beneath the other regions;

irradiating at least some of the other regions of said surface layer of said photoresist layer with ultraviolet from above;

forming a resist pattern for lift-off by developing said photoresist layer to remove a portion of said photoresist layer, a rate of the developing of said first lower portion being less than a rate of developing of said second lower portion because of differences in an extent of exposure of the first and second lower portions to the ultraviolet from above, said differences being dependent upon a level of concentration of the ions implanted into the predetermined regions;

depositing a material to be patterned onto said resist pattern and said substrate from above said resist pattern; and removing said resist pattern, thereby lifting off said material which is on said resist pattern, whereby a fine pattern of said material is left on said substrate.

2. The method of claim 1, wherein said ions are implanted by a focused ion beam method.

3. The method of claim 1, wherein said ions are ions of an element selected from a group consisting of silicon and gold.

4. The method of claim 1, wherein said photoresist layer includes naphthoquinone diazide as a main constituent.

5. The method of claim 1, wherein the removal of said resist pattern is effected by exposing said pattern to a solvent or a plasma atmosphere.

6. A method of fabricating a semiconductor device, comprising in sequence the steps of:

applying a photoresist layer to a substrate, the photoresist layer having a surface layer and a lower layer beneath the surface layer;

implanting ions into predetermined regions in said surface layer of said photoresist layer and leaving other regions in the surface layer free of the implanting of ions, said lower layer thereby being constituted by a first lower portion beneath the predetermined regions and a second lower portion beneath said other regions;

irradiating at least some of the other regions of said surface layer of said photoresist layer with ultraviolet from above;

forming a resist pattern for lift-off by developing said photoresist layer to remove a portion of said photoresist layer, a rate of developing of said first lower portion being less than a rate of developing of said second lower portion because of differences in an extent of exposure of the first and second lower portions to the ultraviolet from above, said differences being dependent upon a level of concentration of the ions implanted into the predetermined regions;

depositing a conductive material to be patterned onto said resist pattern and said substrate from above said resist pattern; and removing said resist pattern, thereby lifting off said material which is on said resist pattern, whereby a fine pattern of said conductive material is left on said substrate.

7. The method of claim 6, wherein said ions are implanted by a focused ion beam method.

8. The method of claim 6, wherein said ions are ions of an element selected from a group consisting of silicon and gold.

9. The method of claim 6, wherein said photoresist layer includes naphthoquinone diazide as a main constituent.

10. The method of claim 6, wherein the removal of said resist pattern is effected by exposing said pattern to a solvent or a plasma atmosphere.

11. A method for fine patterning, comprising in sequence the steps of:

applying a photoresist layer to a substrate, the photoresist layer having a surface layer and a lower layer beneath the surface layer;

implanting ions into predetermined regions in said surface layer of said photoresist layer and leaving other regions in the surface layer free of the implanting of ions, the lower layer thereby being constituted by first lower areas beneath the predetermined regions and by second lower areas beneath the other regions;

irradiating at least some of the other regions of said surface layer of said photoresist layer with ultraviolet from above;

forming a resist pattern for lift-off by developing said photoresist layer to remove a portion of said photoresist layer, the step of forming including forming an undercut beneath the predetermined regions by the developing, the rate of the developing which removes portions of the first lower areas to form the undercuts being less than the rate of developing which removes the second lower areas because of the presence of the predetermined region during the step of irradiating which creates differences in an extent of exposure to the ultraviolet as between the first and second lower areas, said differences being dependent upon a level of concentration of the ion implanted into the predetermined regions;

depositing a material to be patterned onto said resist pattern and said substrate from above said resist pattern; and removing said resist pattern, thereby lifting off said material which is on said resist patter, whereby a fine pattern of said material if left on said substrate.

* * * * *